United States Patent [19]

Bizen et al.

[11] Patent Number: 5,377,081
[45] Date of Patent: Dec. 27, 1994

[54] SURFACE MOUNTABLE ELECTRONIC PART

[75] Inventors: Tatsuo Bizen; Atsushi Inoue; You Funada; Masao Uno; Toshio Hata; Kouichi Kongo, all of Nagaokakyo, Japan

[73] Assignee: Murata Manufacturing Co., Ltd., Kyoto, Japan

[21] Appl. No.: 956,063

[22] Filed: Oct. 2, 1992

[51] Int. Cl.$^5$ .................................. H05K 9/00
[52] U.S. Cl. .................. 361/818; 174/35 R; 174/35 GC; 174/51; 361/753; 361/799; 361/800
[58] Field of Search ............ 174/35 R, 35 GC, 51; 361/816, 818, 753, 799, 800; 331/67, 96, 117 D, 107 SL, 117 R, 117 FE; 333/246, 247; 257/659, 660, 728

[56] References Cited

U.S. PATENT DOCUMENTS

| | | | |
|---|---|---|---|
| 3,614,541 | 10/1971 | Farrand | 361/790 |
| 4,823,233 | 4/1989 | Brown et al. | 361/796 |
| 4,829,432 | 5/1989 | Hershberger et al. | 361/753 |
| 4,833,276 | 5/1989 | Ito | 174/35 R |
| 5,172,077 | 12/1992 | Funada | 361/753 |

FOREIGN PATENT DOCUMENTS

| | | | |
|---|---|---|---|
| 3313967 | 10/1984 | Germany | 174/35 R |
| 3313970 | 10/1984 | Germany | 174/35 R |
| 2-20100 | 1/1990 | Japan | 174/35 R |
| 2222027A | 6/1989 | United Kingdom . | |
| 2252878A | 11/1991 | United Kingdom . | |
| 0391762 | 11/1973 | U.S.S.R. | 174/35 R |

Primary Examiner—Leo P. Picard
Assistant Examiner—Donald A. Sparks
Attorney, Agent, or Firm—Wenderoth, Lind & Ponack

[57] ABSTRACT

The size precision of a surface mountable electronic part is improved and a production thereof is simplified. The surface mountable electronic part is constructed such that a circuit substrate is housed in a shield case of which an end side is open, and the shield case is a resin case having a shield film. A connection pattern is formed on the inner surface of the case, with one end of the connection pattern being disposed so as to correspond to an external connection land of the circuit substrate, and with the other end of the connection pattern extending to the open end of the case.

17 Claims, 2 Drawing Sheets

SURFACE MOUNTABLE ELECTRONIC PART

BACKGROUND OF THE INVENTION

1. Field of the Invention

The present invention relates to a surface mountable electronic part wherein a circuit substrate is covered with a shield case like a hybrid IC, for example.

2. Prior Art

Conventionally, a surface mountable electronic part of this kind shown in FIG. 6 and FIG. 7 is known. A circuit substrate 31 is provided in the surface mountable electronic part 30. F-shaped terminals 32 for an external connection are connected and fixed to end parts of the circuit substrate 31. The circuit substrate 31 is covered with a metal case 34 having a ground terminal 33 and shielded.

The surface mountable electronic part 30 is subjected to a surface mounting on a substrate for mounting (not shown in the drawings) by the F-shaped terminals 32 and the ground terminal 33.

The above mentioned conventional surface mountable electronic part 30 has the following problems:

(1) Since a fitting of the F-shaped terminals 32 and a fitting of the metal case 34 need to be conducted separately, a rationalization of the process is prevented.

(2) It is difficult to construct and fit the F-shaped terminals 32 and the metal case 34 precisely due to the structure, and a longitudinal fitting size shown as L1 and L2 in the drawing and a lateral fitting size shown as D1 and D2 in the drawing cannot be secured accurately. When a precision of the longitudinal fitting size is not accurate, not only is the surface mountable electronic part 30 unstable (a mounting on the substrate for mounting is unstable), but also a solderability is reduced. Further, when a precision of the lateral fitting size is not accurate, the F-shaped terminals 32 and the ground terminal 33 do not fit a soldering land of the substrate for mounting accurately and a connection becomes incomplete.

(3) In this structure, regular space needs to be provided between the metal case 34 and the F-shaped terminals 32 (D1 and D2 correspond to the space) in order to prevent a short circuit. However, as mentioned above, since it is difficult to secure the size with precision, it is necessary to form the space D1 and D2 with plenty of room. Therefore, more space than needed is provided between the metal case 34 and the circuit substrate 31 and a shield becomes incomplete.

(4) Since the F-shaped terminals 32 are electrically connected to the circuit substrate 31 and besides, it is necessary to secure the fitting strength, the size of the soldering land shown in the drawing as D3 must be made sufficiently large. Therefore, the area occupied by a connection of the F-shaped terminals 32 on the surface of the circuit substrate 31 becomes large and as a result, the surface mountable electronic part 30 is prevented from being miniaturized.

SUMMARY OF THE INVENTION

The present invention was invented in the light of the above mentioned problems, and an object of the present invention is to provide a surface mountable electronic part which is highly precise in size and can be produced easily.

In order to accomplish the above object, the present invention constructs a surface mountable electronic part wherein a circuit substrate is housed in a shield case of which an end side is open, and the shield case comprises a resin case having a shield film, and a connection pattern is formed on the inner surface of the case, and an end of the connection pattern is disposed so as to correspond to an external connection land of the circuit substrate and the other end is extended to the open end of the case.

OPERATION

According to the above structure, the connection pattern incorporated in the shield case performs as a terminal for connecting and the circuit substrate is connected to a substrate for mounting by the connection pattern.

Further, since the shield case and the connection pattern can be formed by a resin molding and a plating, it is possible to form them with high precision.

BRIEF DESCRIPTION OF THE DRAWINGS

The manner in which the foregoing and other objects of this invention are accomplished will be apparent from the accompanying specification and claims considered together with the drawings, wherein:

DETAILED DESCRIPTION OF THE PREFERRED EMBODIMENT

Figure 1:
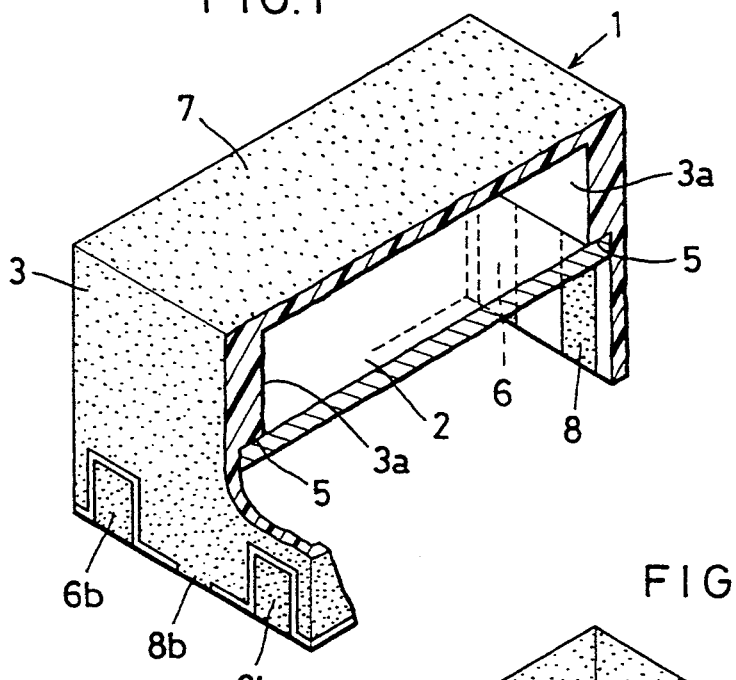
FIG. 1 is a partially cut-away perspective view showing a structure of an example of the present invention.
Figure 2:
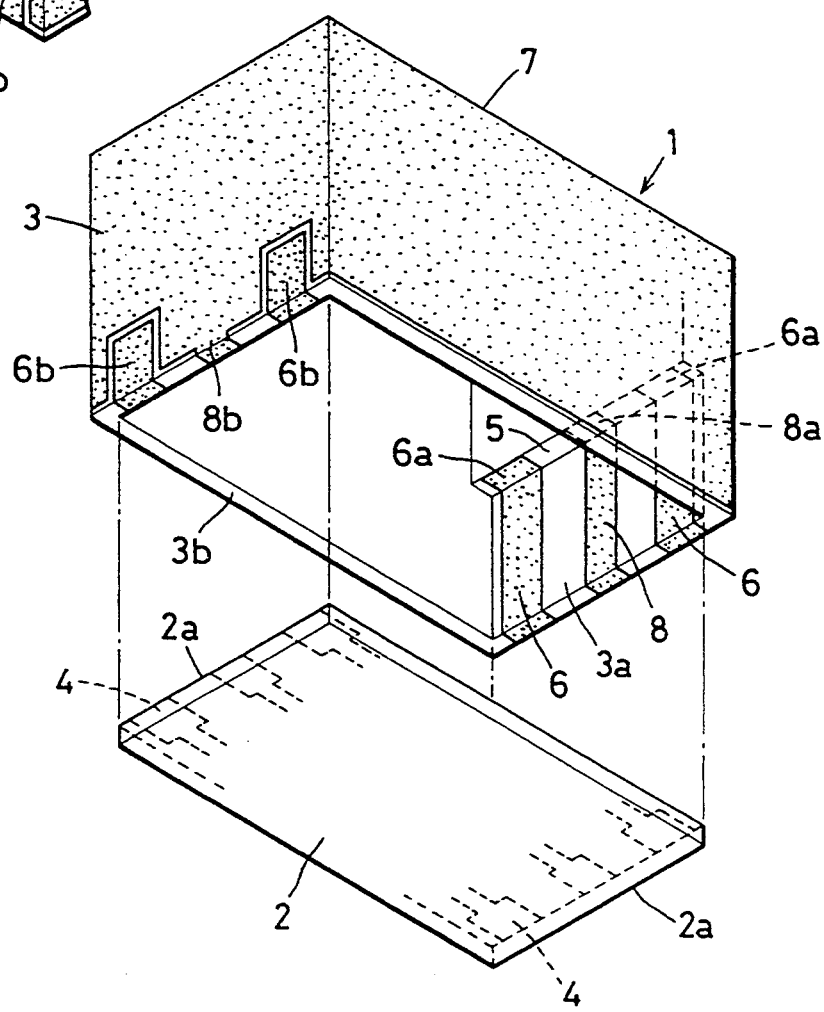
FIG. 2 is an exploded perspective view of the above example.

Now the present invention will be explained in detail based on an example shown in the drawings. FIG. 1 is a partially cut-away perspective view of an example of the present invention, and FIG. 2 is an exploded perspective view thereof.

A surface mountable electronic part 1 has a rectangular circuit substrate 2 and a shield case 3.

A wiring pattern is formed on the circuit substrate 2 and various electronic parts connected to the wiring pattern are mounted on the circuit substrate 2. (Both the wiring pattern and the electronic parts are not shown in the drawings.) Further, an external connection land 4 connected to the wiring pattern is formed at opposite end parts 2a, 2a of the short sides of the substrate 2.

The shield case 3 is in the form of a box of which an end side is open and comprises a heat resistant resin such as a liquid crystal polymer and the like so as to resist an intense heat when soldering. The shield case 3 has the size for covering the outer periphery of the circuit substrate 2, and a step part 5 for mounting the circuit substrate 2 is formed inside the shield case 3. The step part 5 is provided at each of opposite inner side surfaces 3a, 3a of the short sides of the shield case 3.

A connection pattern 6, a ground connection pattern 8 and a shield film 7 are formed on the shield case 3.

These comprise a thin film of metal and are formed on the shield case 3 by a method of plating, evaporating or the like.

The connection pattern 6 is provided at each of opposite inner side surfaces 3a, 3a of the short sides of the shield case 3. An end 6a of the connection pattern 6 is extended over the step part 5 so as to correspond to the external connection land 4 of the above mentioned circuit substrate 2. On the other hand, the other end 6b of the connection pattern 6 is extended slightly to the outer side of the shield case 3 beyond an open end surface 3b of the shield case 3.

The ground connection pattern 8 as well as the connection pattern 6 is provided on the opposite inner surfaces 3a, 3a of the short sides of the shield case 3. The ground connection pattern 8 is disposed parallel to the connection pattern 6, and one end 8a is extended over the step part 5 and the other end 8b is extended slightly to the outer side surface of the shield case 3 beyond the open end surface 3b of the shield case 3 as well.

The shield film 7 is formed on the outer surface of the shield case 3, and while the shield film 7 is provided on the whole outer surface of the shield case 3 with a slight gap about the other end 6b of the connection pattern 6 and the open end surface 3b of the shield case 3, the shield film 7 is connected to the ground connection pattern 8 at the other end 8b thereof.

The shield film 7 can be formed on the inner surface of the shield case 3. In this case, it is necessary to form a slight gap between the shield film 7 and the connection pattern 6 on the inner surface of the shield case 3.

The construction and the connection of the shield case 3 constructed as mentioned above and the circuit substrate 2 are connected structurally and electrically in the below-mentioned manner. First, the circuit substrate 2 is housed in the shield case 3. When the circuit substrate 2 is housed, the step part 5 receives an end part 2a of the substrate 2 and the external connection land 4 corresponds to the connection patterns 6 and 8 of the shield case 3. The corresponding external land 4 and the connection patterns 6 and 8 are connected by soldering. As the connection structure include, the following three structures.

Figure 3:
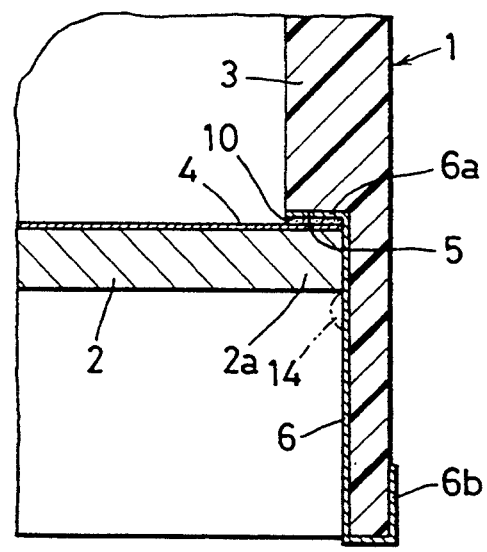
FIG. 3 is the sectional view of the principal portion showing a first structure of a connection of a circuit substrate and a shield case in the above example.

The First Structure (Referring to FIG. 3)

The external connection land 4 is formed on the surface of the substrate 2 at the inward side of the shield case 3 (i.e. facing away from the open end of the shield case 3), and a solder layer 10 is formed in advance on the surface at the ends 6a and 8a of the connection patterns 6 and 8 or on the surface of the external connection land 4. Then, after the circuit substrate 2 is housed in the shield case 3 and mounted on the step part 5, and the external connection land 4 and the connection patterns 6 and 8 correspond with each other, the solder layer 10 is fused so as to connect them.

Figure 4:
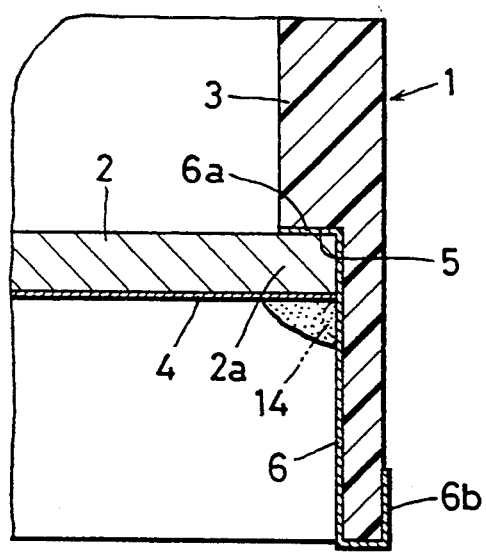
FIG. 4 is the sectional view of the principal portion showing a second structure of a connection of a circuit substrate and a shield case in the above example.

The Second Structure (Referring to FIG. 4)

The external connection land 4 is formed on the surface of the substrate 2 at the outward side of the shield case 3 (i.e. facing toward the open end of the shield case 3). Then, the circuit substrate 2 is housed in the shield case 3 and mounted on the step part 5, and the connection patterns 6 and 8 exposed on the inner side surface 3a of the case and the external connection land 4 are soldered.

Figure 5:
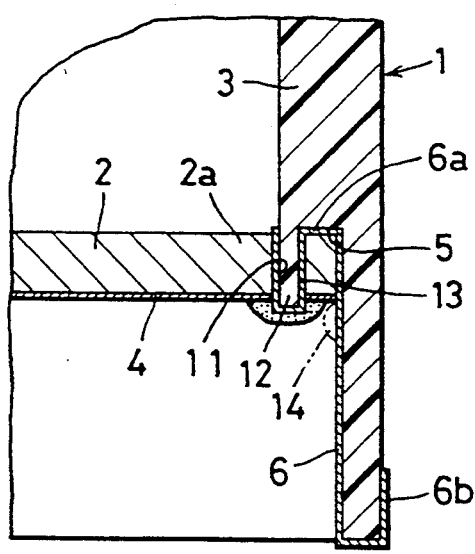
FIG. 5 is the sectional view of the principal part showing a third structure of a connection of a circuit substrate and a shield case of the above example.
Figure 6:
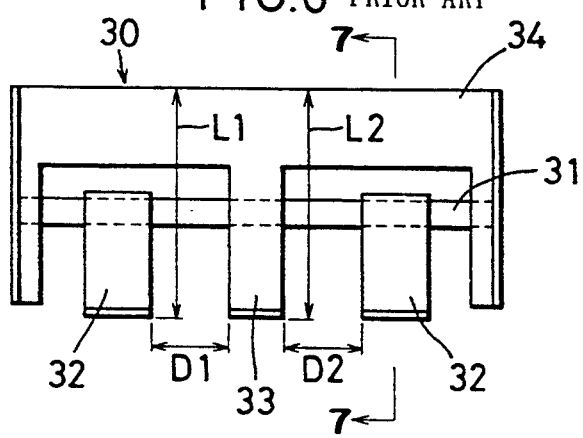
FIG. 6 is a side view of a prior art arrangement.
Figure 7:
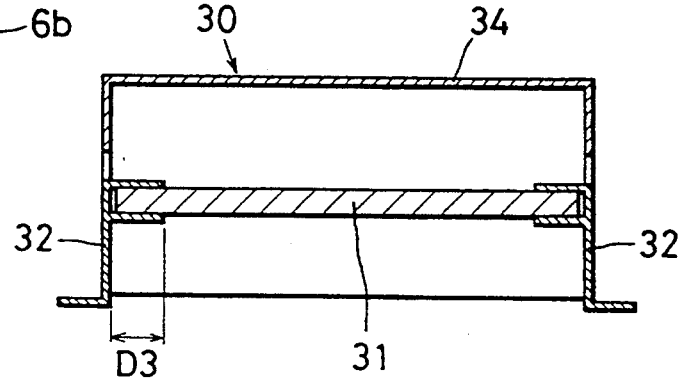
FIG. 7 is sectional view taken along line 7—7 of FIG. 6.

The Third Structure (Referring to FIG. 5)

The external connection land 4 is formed on the surface of the substrate 2 at the outward side of the shield case 3, and a through hole 11 piercing the external connection land 4 is formed in the substrate 2. Further, a projection 12 formed slightly longer than a thickness of a substrate is provided with the step part 5 in the place corresponding to the through hole 11, and a conductor film 13 which electrically connects the connection patterns 6 and 8 is formed on the projection 12. The circuit substrate 2 is housed in the shield case 3 by passing the projection 12 through the through hole 11, and the projection 12 projected from the through hole 11 and the external connection land 4 are soldered. As to the above through hole 11, an internal electrode can be formed inside thereof.

In the above described connection structures, if a rib shown by a reference numeral 14 in the drawings is formed on the inner side surface of the shield case 3, since the housed circuit substrate 2 is fixed provisionally by the rib 14, the following process (such as the soldering process) can be conducted easily.

In the surface mountable electronic part 1 formed in the above mentioned manner, the connection patterns 6 and 8 are extended to the open end of the shield case 3. Therefore, if a connection land and a ground land of a substrate for mounting (not shown in the drawings) are formed in locations corresponding to these connection patterns 6 and 8, the surface mountable electronic part 1 can be mounted by mounting the shield case 3 on the substrate for mounting and soldering the connection patterns 6 and 8 and the connection land and the ground land of the substrate for mounting.

Further, in the surface mountable electronic part 1, the connection patterns 6 and 8 are incorporated on the shield case 3. Therefore, the circuit substrate 2 can be connected to the substrate for mounting without using a connection terminal like an F-shaped terminal 32 in the prior art and furthermore, a fitting of a terminal of the circuit substrate 2 and a fitting of the shield case 3 can be conducted simultaneously.

The shield case 3 can be formed by a resin molding, and the molding precision thereof is sufficiently high. In addition, the connection patterns 6 and 8 can be formed on the shield case 3 with high precision by a plating or the like. Therefore, the formation precision of the constructed surface mountable electronic part 1 is high and as a result, the surface mountable electronic part can be accurately mounted on the substrate for mounting.

Effect of the Invention

According to the present invention mentioned above, the connection pattern which performs as an external connection terminal can be incorporated on a shield case. Therefore, it is possible to fit a terminal Of the circuit substrate and the shield case simultaneously and as a result, the process for constructing the surface mountable electronic part has been improved.

The formation of the shield case and the connection pattern can be conducted by a highly precise forming method such as a resin molding, a plating or the like. Therefore, poor positioning precision during construction which occurs when construction can be attained at a highly precise level, namely the precision of resin obtained in molding and the positioning precision from forming by plating, and other problems, namely lack of stability when mounted and incomplete connections due to the poor positioning precision during construction are solved. As a result, the surface mountable electronic part can be accurately mounted on a substrate.

Further, since the connection pattern and the shield film can be formed precisely, the shield film near the connection pattern can be formed without destroying a shielding property. Therefore, the circuit substrate can be shielded securely.

In addition, the circuit substrate can be connected by fitting the circuit substrate to the shield case, and it is not necessary to use an F-shaped terminal which occupies a large area of the substrate as in a conventional part. Thus, an area of the circuit substrate on which electronic parts can be mounted is increased and as a result, a miniaturization of the surface mountable electronic part is possible.

Although the invention has been described in its preferred form with a certain degree of particularity, it is understood that the present disclosure of the preferred form can be modified in the details of construction and the combination and arrangement of parts to without departing from the spirit and the scope of the invention as hereinafter claimed.

What is claimed is:

1. A surface mountable electronic part, comprising:
   a circuit substrate having at least one external connection land and having predetermined width and length dimensions;
   a shield case having an open end with an opening of predetermined width and length dimensions sufficient to receive said circuit substrate therethrough, said width and length dimensions of said opening being substantially equal to said width and length dimensions, respectively, of said circuit substrate, and said circuit substrate being mounted in said shield case;
   a connection pattern formed on an interior surface of said shield case in at least a first location corresponding to a location of said at least one external connection land of said circuit substrate when said circuit substrate is mounted in said shield case, said connection pattern extending from said first location toward said opening and outwardly of said shield case to a second location on an exterior surface of said shield case; and
   wherein said shield case comprises a resin case having a shield film thereon.

2. A surface mountable electronic part as recited in claim 1, wherein
   said shield film is disposed on an exterior surface of said resin case.

3. A surface mountable electronic part as recited in claim 2, wherein
   a peripheral edge is defined about said opening; and
   said connection pattern extends from said first location on said interior surface of said shield case to said second location on said exterior surface of said shield case by wrapping about said peripheral edge.

4. A surface mountable electronic part as recited in claim 3, further comprising
   a ground connection pattern extending from a third location on said interior surface of said shield case to a fourth location on said exterior surface of said shield case.

5. A surface mountable electronic part as recited in claim 4, wherein
   said ground connection pattern extends from said third location on said interior surface of said shield case to said fourth location on said exterior surface of said shield case by wrapping about said peripheral edge.

6. A surface mountable electronic part as recited in claim 5, wherein
   a gap is formed between said shield film and the portion of said connection pattern disposed on said exterior surface of said shield case.

7. A surface mountable electronic part as recited in claim 6, wherein
   said shield film is connected to said ground connection pattern.

8. A surface mountable electronic part as recited in claim 1, wherein
   a peripheral edge is defined about said opening; and
   said connection pattern extends from said first location on said interior surface of said shield case to said second location on said exterior surface of said shield case by wrapping about said peripheral edge.

9. A surface mountable electronic part as recited in claim 1, further comprising
   a ground connection pattern extending from a third location on said interior surface of said shield case to a fourth location on said exterior surface of said shield case.

10. A surface mountable electronic part as recited in claim 9, wherein
    said shield film is connected to said ground connection pattern.

11. A surface mountable electronic part as recited in claim 9, wherein
    a peripheral edge is defined about said opening; and
    said ground connection pattern extends from said third location on said interior surface of said shield case to said fourth location on said exterior surface of said shield case by wrapping about said peripheral edge.

12. A surface mountable electronic part as recited in claim 1, wherein
    a gap is formed between said shield film and said connection pattern.

13. A surface mountable electronic part as recited in claim 1, wherein
    a inwardly protruding step is formed on said interior surface of said shield case such that a stepped portion of the interior of said shield case which is spaced from said open end has a length dimension smaller than said length dimension of said opening; and
    said circuit substrate is mounted to said step.

14. A surface mountable electronic part as recited in claim 13, wherein
    said length dimension of said circuit substrate is between said length dimension of said opening and said length dimension of said stepped portion.

15. A surface mountable electronic part as recited in claim 1, wherein
    said external connection land is formed on a first surface of said circuit substrate facing away from said open end of said shield case; and
    said external connection land is fused to said connection pattern by solder disposed between a portion of said external connection land disposed on said first surface of said circuit substrate and a portion of said connection pattern disposed on said interior surface of said shield case.

16. A surface mountable electronic part as recited in claim 1, wherein said external connection land is formed on a second surface of said circuit substrate facing toward said open end of said shield case; and said external connection land is soldered to said connection pattern.

17. A surface mountable electronic part as recited in claim 1, wherein an inwardly protruding step is formed on said interior surface of said shield case;

said external connection land is formed on a second surface of said circuit substrate facing toward said open end of said shield case;

a through hole is formed through said circuit substrate and said external connection land;

a projection extends from said step, toward said open end of said shield case, and through said through hole to a location beyond said external connection land;

a conductor film is formed on said projection and is connected to said connection pattern; and said conductor film is soldered to said external connection land.

* * * * *